(12) United States Patent
Freitas et al.

(10) Patent No.: US 10,539,609 B2
(45) Date of Patent: Jan. 21, 2020

(54) METHOD OF CONVERTING HIGH-LEVEL TEST SPECIFICATION LANGUAGE TO LOW-LEVEL TEST IMPLEMENTATION LANGUAGE

(71) Applicants: Arthur Freitas, Toulouse (FR); Cedric Fau, Toulouse (FR); Cedric Labouesse, Aucamville (FR); Philippe Soleil, Aureville (FR); Pascal Sandrez, Toulouse (FR)

(72) Inventors: Arthur Freitas, Toulouse (FR); Cedric Fau, Toulouse (FR); Cedric Labouesse, Aucamville (FR); Philippe Soleil, Aureville (FR); Pascal Sandrez, Toulouse (FR)

(73) Assignee: NXP USA, Inc., Austin, TX (US)

( * ) Notice: Subject to any disclaimer, the term of this patent is extended or adjusted under 35 U.S.C. 154(b) by 561 days.

(21) Appl. No.: 14/707,199

(22) Filed: May 8, 2015

(65) Prior Publication Data
US 2016/0161544 A1 Jun. 9, 2016

(30) Foreign Application Priority Data

Dec. 8, 2014 (WO) .................. PCT/IB2014/002945

(51) Int. Cl.
*G01R 31/26* (2014.01)
*G01R 31/28* (2006.01)
(52) U.S. Cl.
CPC ................................ *G01R 31/2848* (2013.01)
(58) Field of Classification Search
CPC ... G06F 8/315; G06F 8/37; G06F 8/41; G06F 11/3668
See application file for complete search history.

(56) References Cited

U.S. PATENT DOCUMENTS

| 5,473,758 | A * | 12/1995 | Allen | G11C 16/102 |
| | | | | 365/52 |
| 2002/0073375 | A1* | 6/2002 | Hollander | G01R 31/31704 |
| | | | | 714/739 |
| 2007/0220292 | A1* | 9/2007 | Ishihara | G06F 17/5022 |
| | | | | 713/320 |
| 2009/0119084 | A1* | 5/2009 | Nagashima | G01R 31/31907 |
| | | | | 703/14 |
| 2010/0287415 | A1* | 11/2010 | Melis | G06F 11/3664 |
| | | | | 714/38.1 |
| 2011/0167410 | A1* | 7/2011 | Huuck | G06F 8/43 |
| | | | | 717/124 |
| 2013/0055194 | A1* | 2/2013 | Weigert | G06F 8/10 |
| | | | | 717/104 |

(Continued)

FOREIGN PATENT DOCUMENTS

| EP | 1801603 B1 | 3/2010 |
| WO | 2004072670 A1 | 8/2004 |

OTHER PUBLICATIONS

Krishnaswamy, et al, WO 2004/072670 A1, Aug. 26, 2004.*

*Primary Examiner* — Mushfique Siddique
(74) *Attorney, Agent, or Firm* — Charlene R. Jacobsen

(57) ABSTRACT

A method comprising: recording test code defined in a high-level test specification language; and automated analysis of the test code defined in the high-level test specification language before a conversion of the high-level test specification language to a low-level test implementation language configured to enable testing of a target by a test module.

16 Claims, 6 Drawing Sheets

(56) References Cited

U.S. PATENT DOCUMENTS

2014/0310693 A1* 10/2014 Elston ................. G06F 11/3688
717/129
2016/0098562 A1* 4/2016 Hawblitzel ............... G06F 8/41
726/22

* cited by examiner

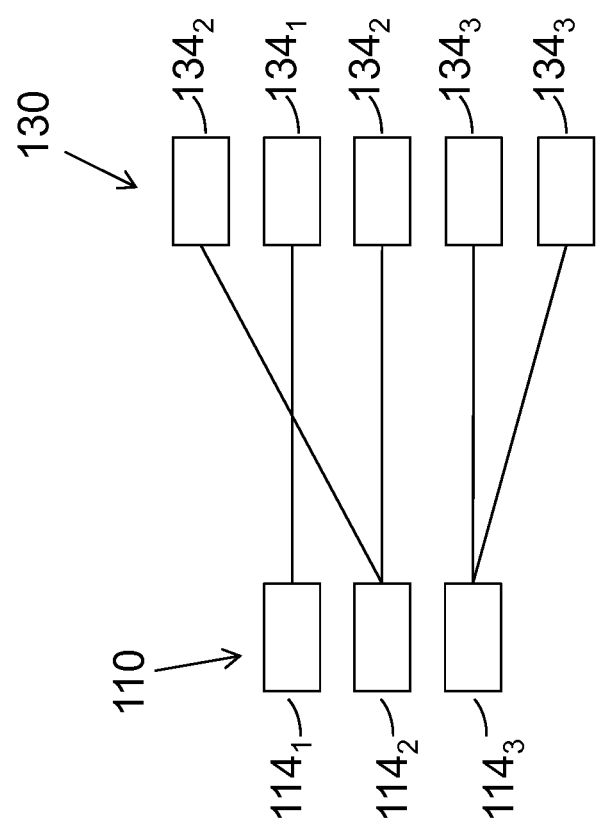

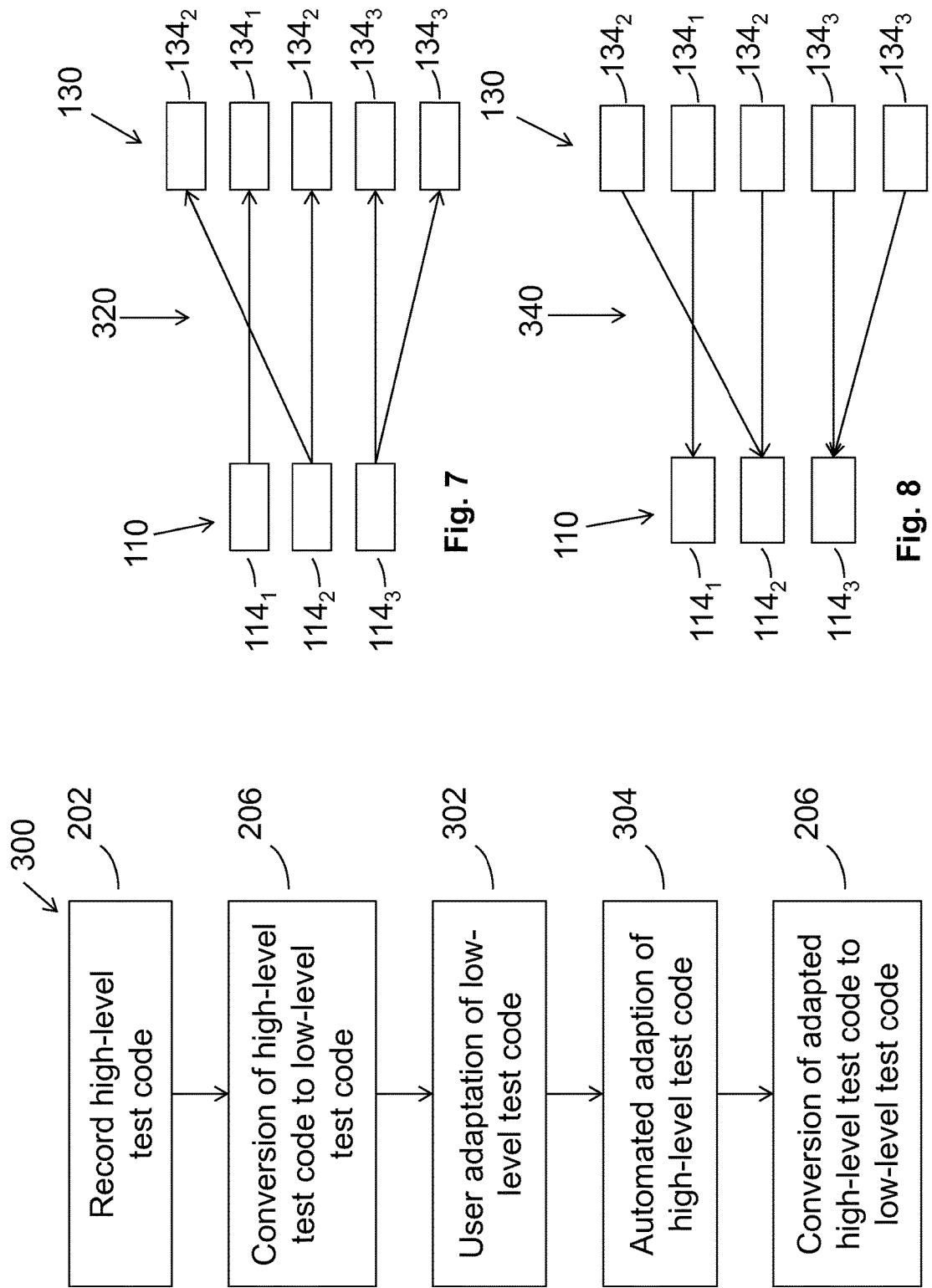

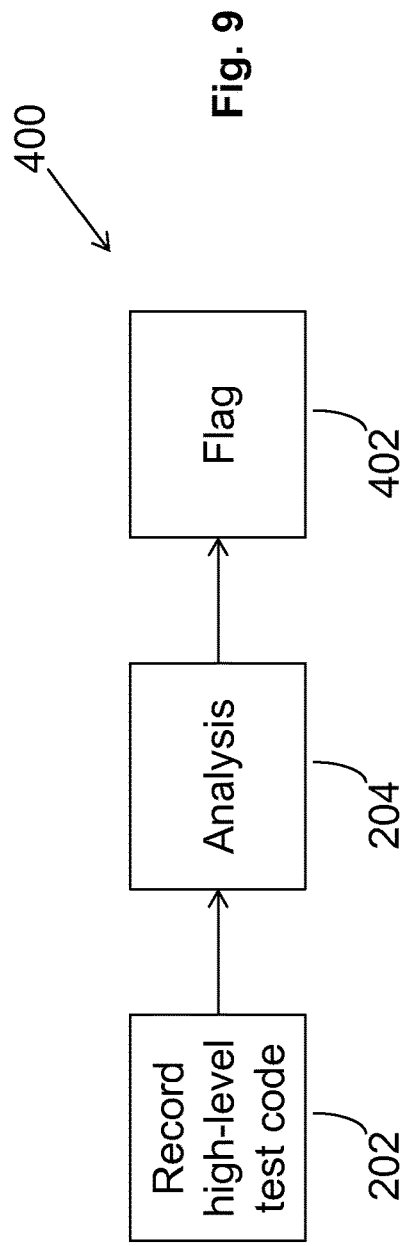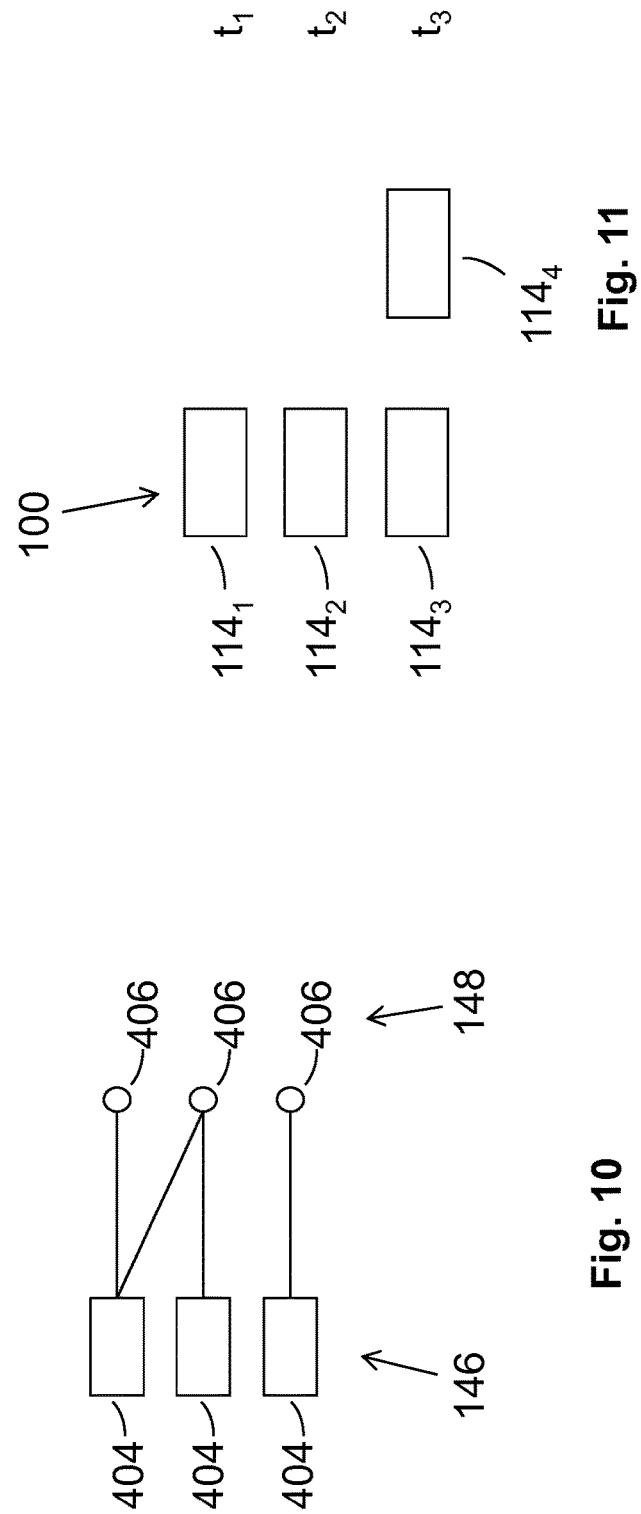

METHOD OF CONVERTING HIGH-LEVEL TEST SPECIFICATION LANGUAGE TO LOW-LEVEL TEST IMPLEMENTATION LANGUAGE

CROSS REFERENCE TO RELATED APPLICATION(S)

The present application claims priority to International Patent Application No. PCT/IB2014/002945, entitled "TESTING OF SEMICONDUCTOR DEVICES," filed on Dec. 8, 2014, the entirety of which is herein incorporated by reference.

FIELD OF THE INVENTION

This invention relates to real or simulated testing of target devices such as, for example, semiconductor devices and integrated circuits. It may be particularly useful for target devices that comprise analog circuits.

BACKGROUND OF THE INVENTION

Testing of target devices may be performed using different testing modules. Each different testing module may potentially use a different low-level test implementation language to control its operations during testing.

WO2004/072670 describes an example of a high-level test specification language that uses general-purpose object-oriented constructs e.g. C++ objects and classes to develop test programs for an open architecture tester. A standard C++ compiler may be used to create an executable test program. This document suggests that device-specific data or device-test-specific data may be an input at execution time.

It would be desirable to write test code in a generic high-level test specification language that can be converted to particular low-level test code defined in a particular low-level test implementation language dependent upon the particular testing module to be used.

SUMMARY OF THE INVENTION

The present invention provides a as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 5 schematically shows an example of an embodiment in which each portion of the high-level test code are associated with one or more corresponding portions of the low-level test code;

FIG. 6 schematically shows an example of an embodiment of a method which is a specific example of the method illustrated in FIG. 4;

FIG. 7 schematically shows an example of an embodiment in which each portion of the high-level test code is converted to one or more portions of the low-level test code;

FIG. 8 schematically shows an example of an embodiment in which the automated analysis comprises automated adaption of the high-level test code;

FIG. 9 schematically shows an example of an embodiment of a method that is similar to the method illustrated in FIG. 4.

FIG. 10 schematically shows an example of a test and a target device; and

FIG. 11 schematically shows an example of an embodiment that determines timing using the high-level test code.

DETAILED DESCRIPTION OF THE PREFERRED EMBODIMENTS

Because the illustrated embodiments of the present invention may, for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
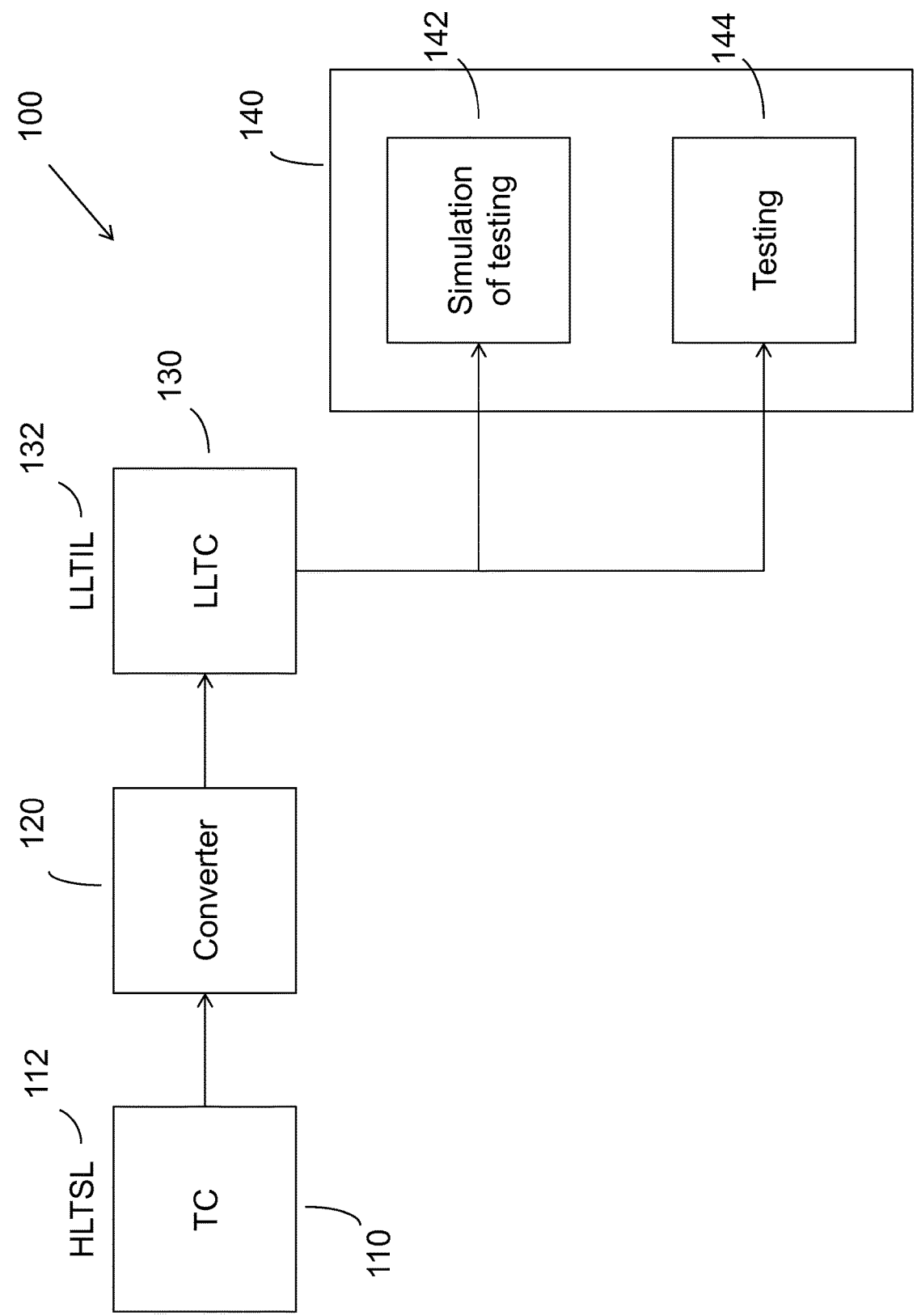
FIG. 1 schematically shows an example of an embodiment of an apparatus or system that is configured to convert high-level test code defined in a high-level test specification language into low-level test code defined in a low-level test implementation language.

FIG. 1 schematically shows an example of an embodiment of an apparatus or system 100 that is configured to convert high-level test code 110 defined in a high-level test specification language 112 using a converter 120 into low-level test code 130 defined in a low-level test implementation language 132.

The low-level test implementation language 132 is configured to enable testing of a target device by a test module. The target device may, for example, be a real or simulated device. It may, for example, be a real or simulated semiconductor device or a real or simulated integrated circuit. In some examples, the target device may be a real or simulated device comprising analog circuitry such as, for example, one or more bipolar transistors.

The test module may be a real test module or a simulated test module. Whether it is a real test module or a simulated test module, it may be one of a plurality of different test modules that could be used for the testing procedure. In some examples, each of these different test modules requires a different low-level test implementation language 132 to control its functionality.

FIG. 1 illustrates that the low-level test code 130 may be used 140 for simulation of testing 142 and/or real testing 144. Where the low-level test code 130 is used for simulation of testing 142 then the target device and the test module are both simulated. Where the low-level test code 130 is used for real testing 144 then the target device and the test module are both real.

The high-level test specification language 112 is an abstracted language comprising at least functions and function parameters. In some examples, it may be an object-orientated language. The high-level test specification language 112 is independent of which one of the plurality of different possible test modules is to be used for testing.

Figure 2:
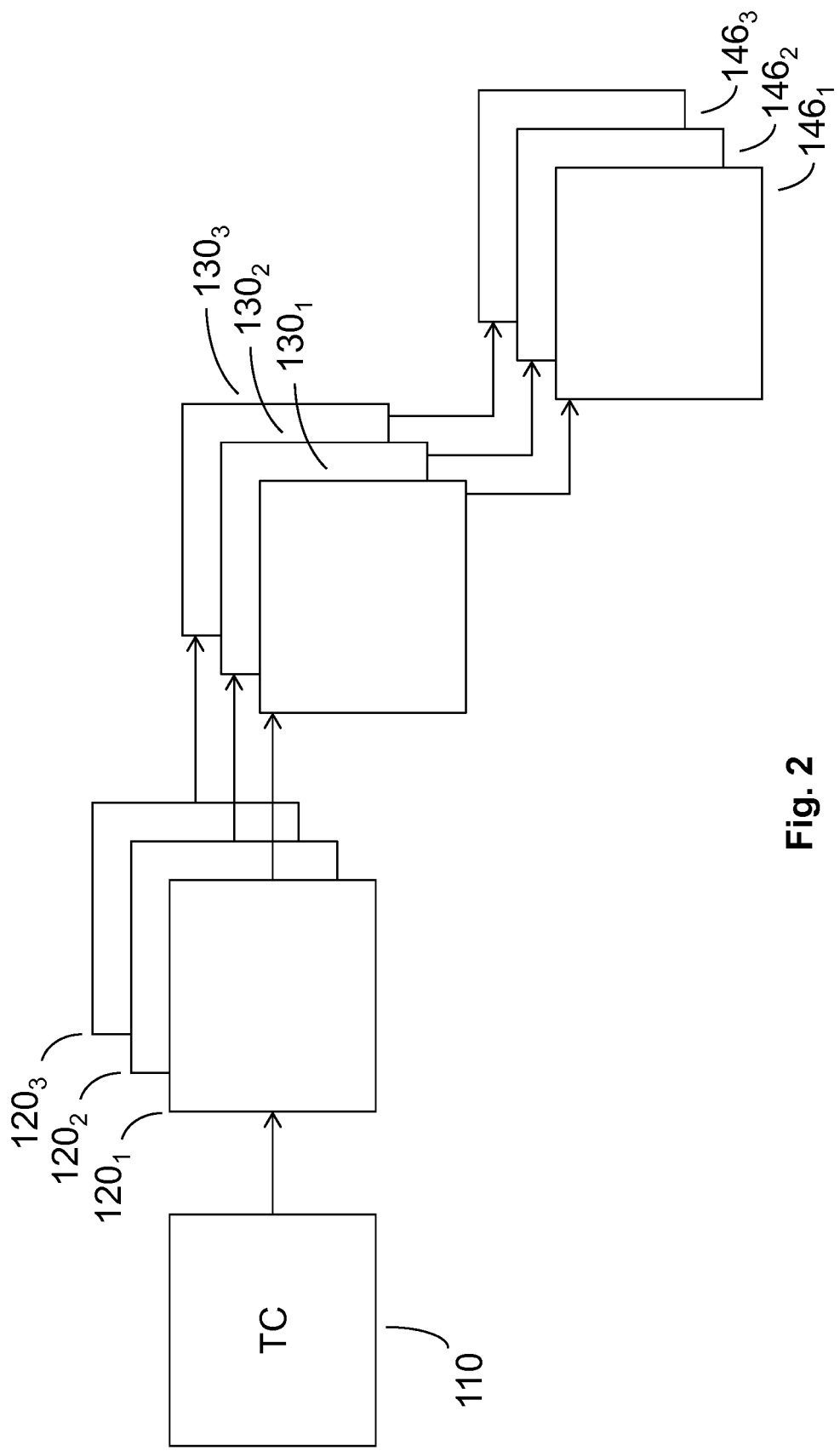
FIG. 2 schematically shows an example of an embodiment of an apparatus or system that is configured to convert the generic high-level test code defined in the high-level test specification language into different instances of low-level test code suitable for use on different test modules using different converters.

In this way, the high-level test code 110 defined in the high-level test specification language 112 is a generic language suitable for conversion, using different converters 120, into different instances of low-level test code 130 suitable for use on different test modules. This is, for example, schematically shown in FIG. 2. In this example the common or generic high-level test code 110 defined in the high-level test specification language 112 is converted by any of a plurality of different converters $120_n$. The result of the conversion by a particular converter $120_n$ is a particular low-level test code $130_n$ written in a particular low-level test implementation language $132_n$. The particular low-level test code $130_n$ is intended for use only on a particular one or more test modules $146_n$. As previously described, the particular test modules $146_n$ may be real or simulated.

It will therefore be appreciated that the converter 120 is configured to convert the generic high-level test code 110 defined in the high-level test specification language 112 into a particular low-level test implementation language 132. The result of this conversion produces the low-level test code 130. In some, but not necessarily all, examples the converter 120 may be implemented as a low-level test implementation language specific compiler.

Figure 3:
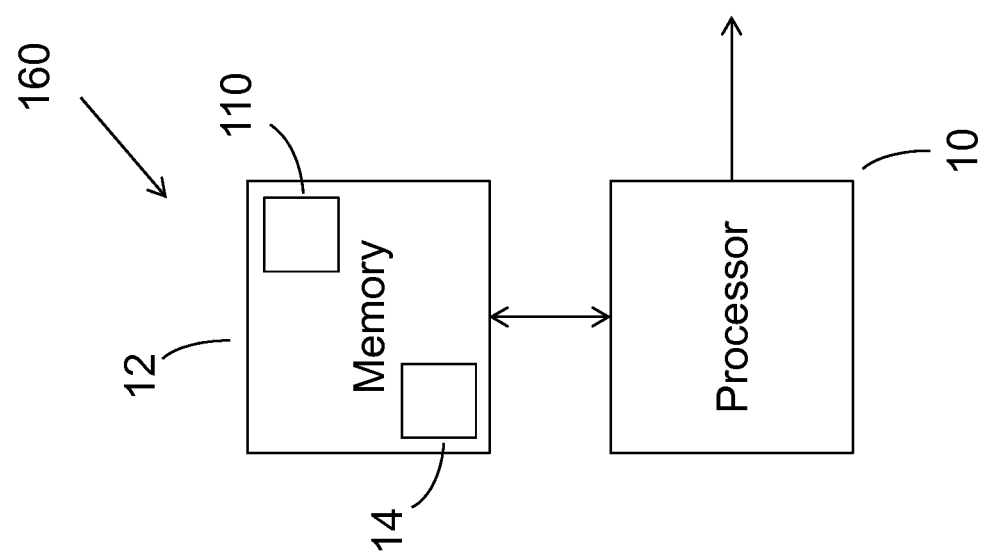
FIG. 3 schematically shows an example of an embodiment of the apparatus or system from the perspective of hardware components.

FIG. 3 schematically shows an example of an embodiment of a controller 160 for the apparatus or system 100.

The controller 160 is configured to control automated analysis of the high-level test code 110 defined in the high-level test specification language 112 before a conversion of the high-level test code 110 to low-level test code 130 defined in the low-level test implementation language 132 and configured to enable testing of a target by a test module.

Implementation of the controller 160 may be as controller circuitry. The controller 160 may be implemented in hardware alone, have certain aspects in software including firmware alone or can be a combination of hardware and software (including firmware).

As illustrated in FIG. 3 the controller 160 may be implemented using instructions that enable hardware functionality, for example, by using executable computer program instructions 14 in a general-purpose or special-purpose processor 10 that may be stored on a computer readable storage medium (disk, memory etc) to be executed by such a processor 10.

The processor 10 is configured to read from and write to the memory 12. The processor 10 may also comprise an output interface via which data and/or commands are output by the processor 10 and an input interface via which data and/or commands are input to the processor 10.

The memory 12 stores a computer program 14 comprising computer program instructions (computer program code) that controls the operation of the apparatus 100 when loaded into the processor 10. The computer program instructions, of the computer program 14, provide the logic and routines that enables the apparatus to perform the methods shown in the Figures. The processor 10 by reading the memory 12 is able to load and execute the computer program 14.

The apparatus 100 therefore comprises: at least one processor 10; and at least one memory 14 including computer program code 14 the at least one memory 12 and the computer program code 14 configured to, with the at least one processor 10, cause the apparatus 100 at least to perform: causing recording high-level test code 110 defined in a high-level test specification language 112; and causing automated analysis of the high-level test code 110 defined in the high-level test specification language 112 before a conversion of the high-level test specification language 112 to a low-level test implementation language 132 configured to enable testing of a target by a test module.

The computer program 14 may arrive at the apparatus 100 via any suitable delivery mechanism. The delivery mechanism may be, for example, a non-transitory computer-readable storage medium, a computer program product, a memory device, a record medium such as a compact disc read-only memory (CD-ROM) or digital versatile disc (DVD), an article of manufacture that tangibly embodies the computer program 14. The delivery mechanism may be a signal configured to reliably transfer the computer program 14. The apparatus 100 may propagate or transmit the computer program 14 as a computer data signal.

Although the memory 12 is illustrated as a single component/circuitry it may be implemented as one or more separate components/circuitry some or all of which may be integrated/removable and/or may provide permanent/semi-permanent/dynamic/cached storage.

Although the processor 10 is illustrated as a single component/circuitry it may be implemented as one or more separate components/circuitry some or all of which may be integrated/removable. The processor 10 may be a single core or multi-core processor.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

In this example, the memory 12 records the high-level test code 110 defined in the high-level test specification language 112.

The computer program 14 when loaded into the processor 10 enables the conversion of the high-level test code 110 to a particular low-level test code 130. It will therefore be appreciated that different versions of the computer program 14 may be required to produce low-level test code 130 in different low-level test implementation languages 132.

Figure 4:
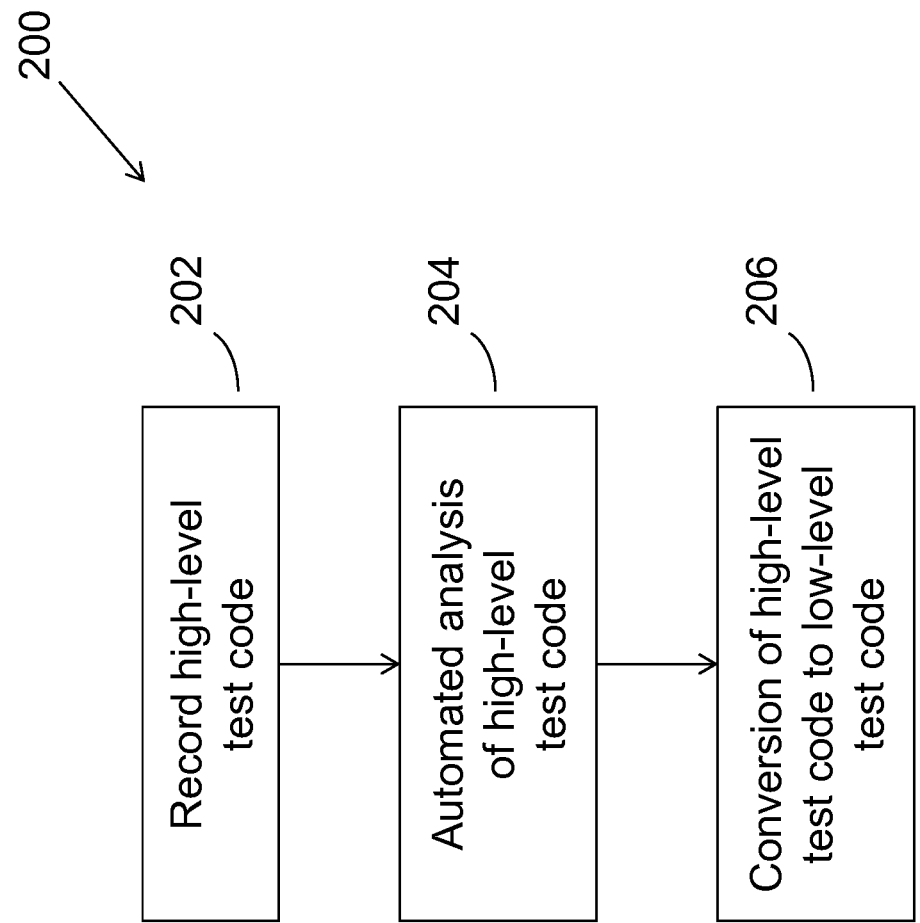
FIG. 4 schematically shows an example of an embodiment of a method which includes automated analysis of the high-level test code.

FIG. 4 schematically shows an example of an embodiment of a method 200 which includes two distinct stages which may be performed separately and separated in time. The first stage is automated analysis of the high-level test code 110 which is performed at block 204 and the second stage is the conversion of the high-level test code 110 from the high-level test specification language 112 to a particular low-level test implementation language 132 to create low-level test code 130 which is performed at block 206.

The method 200 comprises, at block 202, recording high-level test code 110 defined in a high-level test specification language 112.

Next, at block 204 the method 200 performs automated analysis of the high-level test code 110 defined in the high-level test specification language 112. It should be noted that this automated analysis 204 is performed before a subsequent conversion 206 of the high-level test specification language 112 to a low-level test implementation language 132 configured to enable testing of a target test module.

Although FIG. 4 illustrates that the block 204 performing automated analysis of the high-level test code 110 occurs immediately after the block 202 recording the high-level test code 110, this is mainly for the sake of a clear description of the method. In the actual implementations, a variety of one, none or more different blocks may intercede between the block 202 and block 204. In some examples, the high-level test code 110 may for example be converted to a low-level test implementation language 132 to produce low-level test code 130 before automated analysis of the high-level test code 110 occurs at block 204. However, even in this scenario, it may be possible for conversion of the high-level test code 110 to be performed after the automated analysis of the high-level test code 110 at block 204. Such later conversion may be to the same low-level test implementation language 132 as that produced by the earlier conversion performed before the automated analysis of the high-level test code 110 or may be to a different low-level test implementation language 132.

The low-level test code 130 when executed by the appropriate test module (real or simulated) may put the target (real or simulated) in specific modes and measures internal parameters.

FIG. 5 schematically shows an example of an embodiment in which the high-level test code 110 may, for example, comprise a set of instructions $114_n$ and the corresponding low-level test code 130 comprise a set of corresponding instructions $134_n$. FIG. 5 illustrates the process of conversion of the instructions $114_n$ in the high-level test specification language 112 to corresponding instructions $134_n$ in a low-level test implementation language 132. It should be realised that the details of the conversion will be dependent upon the particular characteristics of the low-level test implementation language 132.

In this example each instruction $114_n$ of the high-level test code 110, when converted, produces one or more instructions $134_n$ in the low-level test code 130. Each of the instructions $134_n$ is defined in the low-level test implementation language 132.

In the figure, a common index n has been used to illustrate the conversion of a particular instruction $114_n$ of the high-level test code 110 to a particular instruction or instructions $134_n$ of the low-level test code 130.

In this example a first portion of the high-level test code 110 comprising a first high-level instruction $114_1$ in the high-level test specification language 112 is converted to a corresponding first portion of the low-level test code 130 that comprises a single low-level instruction 134 defined in the low-level test implementation language 132.

A second portion of the high-level test code 110 comprising a second high-level instruction $114_2$ in the high-level test specification language 112 is converted to a corresponding second portion of the low-level test code 130 that comprises two low-level instruction $134_2$ defined in the low-level test implementation language 132.

A third portion of the high-level test code 110 comprising a third high-level instruction $114_3$ in the high-level test specification language 112 is converted to a corresponding third portion of the low-level test code 130 that comprises two low-level instructions $134_3$ defined in the low-level test implementation language 132. In this example, the two low-level instructions $134_3$ are separated by another low-level instruction.

It will be appreciated that the conversion of the set of high-level instructions in the high-level test code 110 to the set of low-level instructions in the low-level test code 130 does not necessarily preserve the number and/or ordering of instructions. For example, in the illustrated example, the second portion of the low-level test code 130 comprising the two instructions $134_2$ is split with the first portion comprising the instruction $134_1$ separating the two low-level instructions $134_2$. The ordering of the low-level instructions in the low-level test code 130 is consequently $134_2$, $134_1$, $134_2$, $134_3$ and $134_3$.

FIG. 6 schematically shows an example of an embodiment of a method 300 which is a specific example of the method 200 illustrated in FIG. 4.

In this example, the automated analysis of the high-level test code 110 performed at block 204 of FIG. 4, is performed at block 304 of FIG. 6 and comprises automated adaption of the high-level test code 110 defined in the high-level test specification language 112.

In this method 300, at block 202, high-level test code 110 defined in the high-level test specification language 112 is recorded. At block 206, there is a first conversion of the high-level test code 110 to first low-level test code 130. The first low-level test code 130 is defined in a first low-level test implementation language 132.

At block 302, a user adapts the first low-level test code 130. Next, at block 304, which corresponds to block 204 of FIG. 4, automated adaptation of the high-level test code 110 is performed in response to the user-adaptation of the first low-level test code 130 at block 302 to create adapted high-level test code 110.

Optionally, either now or at some later time, the adapted high-level test code 110 may be converted at block 206 to produce second low-level test code 130. The second low-level test code 130 is defined in a second low-level test implementation language 132. In some examples the first and second low-level test implementation languages 132 may be the same language, however in other examples the first and second low-level test implementation languages 132 may be different languages.

FIG. 7 schematically shows an example of an embodiment of set of instructions $114_n$ of the high-level test code 110 and a set of instructions $134_n$ of the first low-level test code 130. It is equivalent to FIG. 5 previously described. However, this figure is intended to illustrate the association 320 between the high-level instructions 114 of the high-level test code 110 and the low-level instructions 134 of the low-level test code 130.

In this example, the automated analysis performed at block 204 may comprise automated tagging of the portions of the high-level test code 110 defined in the high-level test specification language 112 and the automated tagging of corresponding portions of the low-level test code 130 defined in the low-level test implementation language 132.

As previously described a particular portion of the high-level test code 110 has one or more corresponding portions of the low-level test code 130 which have been produced by conversion of that portion of the high-level test code 110 to one or more portions of the low-level test code. The automated analysis, performed at block 204, automatically associates a particular portion of the high-level test code 110 and its one or more corresponding portions of the low-level test code 130. For example, referring to FIG. 7, the first portion of the high-level test code 110 comprising a high-level instruction $114_1$ is associated with the low-level instruction $134_1$ of the first portion of the low-level test code 130. The high-level instruction $114_2$ in the second portion of the high-level test code 110 is associated with both of the low-level instructions $134_2$ of the second portion of the low-level test code 130. The high-level instruction $114_3$ of the third portion of the high-level test code 110 is associated with both the low-level instructions $134_3$ of the third portion of the low-level test code 130.

In the example of FIG. 7, the index n which is used as a subscript to the high-level instructions $114_n$ and the corresponding low-level instructions $134_n$ may be considered to be a tag or representative of a tag. A particular portion of the high-level test code 110 is then associated with a particular tag and the corresponding portion of the low-level test code 130 and each of the one or more low-level instructions $134_n$ comprised within that portion are automatically tagged with the same tag.

FIG. 8 schematically shows an example of an embodiment in which the automated analysis performed at block 204 of FIG. 4 comprises automated adaptation 340 of the high-level test code 110 defined in the high-level test specification language 112. This process comprises automated adaption 340 of a particular portion of the high-level test code 110 in response to user-adaptation of a corresponding portion of the low-level test code 130. The figure illustrates that adaptation of a low-level instruction $134_n$, of the low-level test code 130 has a consequence of adapting the corresponding high-level instruction $114_n$ of the high-level test code 110.

If an adaptation is made to the low-level test code 130, it may or may not be possible to convert such an adaptation at the level of the low-level test implementation language into a corresponding adaptation at the level of the high-level test specification language. If such a back conversion is possible, which will occur if it is possible to disassemble the adaptation made to the low-level test code 130, then it is possible to implement the adaptation to the high-level test code 110 using high-level test specification language 112. However, if such back conversion is not possible because, for example, disassembling of the adapted low-level test code 130 is not possible, then it may be required to adapt the high-level test code 110 by inserting low-level test implementation language 132 into the high-level test code 110. Thus the automated adaption of the high-level test code 110 defined in the high-level test specification language 112 may comprise addition of test code defined in the high-level test specification language 112 and/or addition of test code defined in the low-level test implementation language 132.

As an example, new code may be added to the high-level test code 110 defined in the high-level test specification language 112 in response to the definition of new low-level code in the corresponding portion of the low-level test code 130. The new code is defined using the high-level test specification language 112 if the new low-level code can be disassembled into high-level test specification language 112 and is defined using the low-level test implementation language 132 if the new low-level code cannot be disassembled into high-level test specification language 112.

The following examples are examples where automated adaption of the high-level test code 110 comprises removal of high-level test code, addition of test code to the high-level test code 110 (either as high-level test specification language 112 or as low-level test implementation language 132) or editing of test code of the high-level test code 110 (either in the form of high-level test specification language 112 or low-level test implementation language 132).

Table 1 shows high-level test code 110 (column 1) and an XML representation of the test code (column 2) that comprises tags. Each instruction in the high-level test code 110 has a distinct and different tag aan.

| High-Level Test Code 110 | High-Level Test Code 110 with tags |
|---|---|
| VDD_VI.Voltage.Force (5 V,2 mA) | <line hash=aa1> VDD_VI.Voltage.Force(5 V,2 mA) </line> |
| TXD_DIG.setState(0) | <line hash=aa2>TXD_DIG.setState(0) </line> |
| Next | <line hash=aa3>Next </line> |
| VDD_VI.Voltage.Ramp (5 V ,2 V, 100, 20 us) | <line hash=aa4>VDD_VI.Voltage.Ramp (5 V, 2 V, 100, 20 us) </line> |
| Next | <line hash=aa5>Next </line> |

Table 2 shows instructions of the high-level test code 110 (column 2) and corresponding instructions of a corresponding low-level test code 130 (column 3). The corresponding low-level test code 130 is obtained by converting the high-level test specification language of the high-level test code 110 to low-level test implementation language. An instruction of the high-level test code 110, when converted, creates one or more corresponding instructions in the low-level test code 130. Corresponding instructions in the high-level test code 110 and the low-level test code 130 are associated via a common tag (column 1).

| Tag | High-Level Test Code 110 | Low-Level Test Code 130 (SystemVerilog) |
|---|---|---|
| aa1 | VDD_VI.Voltage.Force(5 V, 2 mA) | fork VDD_VI.forceV(5' V, 2' mA); |
| aa2 | TXD_DIG.setState(0) | TXD_DIG.setState(1'b0)); join_none |
| aa3 | Next | #('TESTER_TIME_STEP); |
| aa4 | VDD_VI.Voltage.Ramp(5 V, 2 V, 100, 20 us) | begin real v, step; v=5.0; step=(5.0 − 2.0)/100.0; for(int ii=0; ii<100; ii++) begin VDD_VI.forceV(v); v+=step; #(20' us); end end |
| aa5 | Next | #('TESTER_TIME_STEP); |

Table 3 shows user adaptation (deletion) of a portion of the low-level test code 130 and the consequential automated adaptation (deletion) of the corresponding portion in high-level test code 110. Deletion is shown by strikethrough.

| Tag | High-Level Test Code 110 | Low-Level Test Code 130 (SystemVerilog) |
|---|---|---|
| aa1 | VDD_VI.Voltage.Force(5 V, 2m A) | fork VDD_VI.forceV(5' V, 2' mA); join_none |
| ~~aa2~~ | ~~TXD_DIG.setState(0)~~ | ~~TXD_DIG.setState(1'b0));~~ |
| aa3 | Next | #('TESTER_TIME_STEP); |
| aa4 | VDD_VI.Voltage.Ramp(5 V, 2 V, 100, 20 us) | begin real v, step; v=5.0; |

| Tag | High-Level Test Code 110 | Low-Level Test Code 130 (SystemVerilog) |
|---|---|---|
| | | step=(5.0 − 2.0)/100.0;<br>for(int ii=0; ii<100; ii++)<br>begin<br>VDD_VI.forceV(v);<br>v+=step;<br>#(20' us);<br>end<br>end |
| aa5 | Next | #('TESTER_TIME_STEP); |

Table 4 shows user adaptation (addition) of a portion of the low-level test code 130 and the consequential automated adaptation (addition) of the corresponding portion in high-level test code 110 using high-level test specification language 112. Addition is shown by underlining.

| Tag | High-Level Test Code 110 | Low-Level Test Code 130 (SystemVerilog) |
|---|---|---|
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0)); |
| aa6 | RXD_DIG.setState(X) | RXD_DIG.setState(1'bX);<br>join_none |
| aa3 | Next | #('TESTER_TIME_STEP); |
| aa4 | VDD_VI.Voltage.Ramp(5 V,2 V, 100, 20 us) | begin<br>real v, step;<br>v=5.0;<br>step=(5.0 − 2.0)/100.0;<br>for(int ii=0; ii<100; ii++)<br>begin<br>VDD_VI.forceV(v);<br>v+=step;<br>#(20' us);<br>end<br>end |
| aa5 | Next | #('TESTER_TIME_STEP); |

Table 5 shows user adaptation (addition) of a portion of the low-level test code 130 and the consequential automated adaptation (addition) of the corresponding portion in high-level test code 110 using low-level test implementation language 132. Addition is shown by underlining.

| Tag | High-Level Test Code 110 | Low-Level Test Code 130 (SystemVerilog) |
|---|---|---|
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0)); |
| aa6 | systemVerilog($display("hello!");) | $display("hello!");<br>join_none |
| aa3 | Next | #('TESTER_TIME_STEP); |
| aa4 | VDD_VI.Voltage.Ramp(5 V, 2 V, 100, 20 us) | begin<br>real v, step;<br>v=5.0;<br>step=(5.0 − 2.0)/100.0;<br>for(int ii=0; ii<100; ii++)<br>begin<br>VDD_VI.forceV(v);<br>v+=step;<br>#(20' us);<br>end<br>end |
| aa5 | Next | #('TESTER_TIME_STEP); |

Table 6 shows user adaptation (edit) of a portion of the low-level test code 130 and the consequential automated adaptation (edit) of the corresponding portion in high-level test code 110 using high-level test specification language 112. Change is shown by underlining.

| Tag | High-Level Test Code 110 | Low-Level Test Code 130 (SystemVerilog) |
|---|---|---|
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0));<br>join_none |
| aa3 | Next | #('TESTER_TIME_STEP); |
| aa4 | VDD_VI.Voltage.Ramp(3V, 2 V, 100, 20 us) | begin<br>real v, step;<br>v=3.0;<br>step=( 3.0− 2.0)/100.0;<br>for(int ii=0; ii<100; ii++)<br>begin<br>VDD_VI.forceV(v);<br>v+=step;<br>#(20' us);<br>end<br>end |
| aa5 | Next | #('TESTER_TIME_STEP); |

Table 7 shows user adaptation (edit) of a portion of the low-level test code 130 and the consequential automated adaptation (edit) of the corresponding portion in high-level test code 110 using low-level test specification language 112. Change is shown by underlining and strikethrough.

| Tag | High-Level Test Code 110 | Low-Level Test Code 130 (SystemVerilog) |
|---|---|---|
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0));<br>join_none |
| aa3 | Next | #('TESTER_TIME_STEP); |
| aa4 | ~~VDD_VI.Voltage.Ramp(5V,2V,100,20us)~~<br>systemVerilog(<br>begin | begin<br>real v, step;<br>v=5.0; |

-continued

| Tag | High-Level Test Code 110 | Low-Level Test Code 130 (SystemVerilog) |
|---|---|---|
| | real v, step;<br>v=5.0;<br>step=( 5.0− 2.0)/100.0;<br>for(int ii=0; ii<100; ii++)<br>begin<br>VDD_VI.forceV(v);<br>v+=step;<br>#(20' us);<br>RXD_DIG.get_state('H');<br>end<br>end<br>) | step=( 5.0 − 2.0)/100.0;<br>for(int ii=0; ii<100; ii++)<br>begin<br>VDD_VI.forceV(v);<br>v+=step;<br>#(20' us);<br>RXD_DIG.get_state('H');<br>end<br>end |
| aa5 | Next | #('TESTER_TIME_STEP'); |

Table 8 shows high-level test code 110 (column 2) that has been converted to low-level test code 130 (column 3). One of the portions of the high-level test code 110 has been converted into multiple portions of the low-level test code 130

| Tag | High-Level Test Code 110 | Low-Level Test Code 130 (SystemVerilog) |
|---|---|---|
| aa6 | | real Var1[19:0]; |
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0));<br>join_none |
| aa3 | Next | #('TESTER_TIME_STEP'); |
| aa4 | VDD_VI.Voltage.Ramp(5 V, 2 V, 100,20us) | begin<br>real v, step;<br>v=5.0;<br>step=(5.0 − 2.0)/100.0;<br>for(int ii=0; ii<100; ii++)<br>begin<br>VDD_VI.forceV(v);<br>v+=step;<br>#(20' us);<br>end<br>end |
| aa5 | Next | #('TESTER_TIME_STEP'); |
| aa6 | Var1=RXD_VI.Voltage.measure (20,'Array') | for(int ii=0; ii<20; ii++)<br>begin<br>Var1[ii]=RXD_VI.sense;<br>#('TESTER_TIME_STEP');<br>end |

Table 9 shows user adaptation (edit) of a portion of the low-level test code 130 and the consequential automated adaptation (edit) of the corresponding portion in high-level test code 110 using high-level test specification language 112 and automated adaptation of any lower-level test code 130 that has the same tag. Change is shown by underlining.

| Tag | High-Level Test Code 110 | Low-Level Test Code 130 (SystemVerilog) |
|---|---|---|
| aa6 | | real Var1[<u>14</u>:0]; |
| aa1 | VDD_VI.Voltage.Force(5 V, 2 mA) | fork<br>VDD_VI.forceV(5' V, 2' mA); |
| aa2 | TXD_DIG.setState(0) | TXD_DIG.setState(1'b0));<br>join_none |
| aa3 | Next | #('TESTER_TIME_STEP'); |
| aa4 | VDD_VI.Voltage.Ramp(5 V, 2 V, 100, 20 us) | begin<br>real v, step;<br>v=5.0;<br>step=(5.0 − 2.0)/100.0;<br>for(int ii=0; ii<100; ii++)<br>begin |

-continued

| Tag | High-Level Test Code 110 | Low-Level Test Code 130 (SystemVerilog) |
|---|---|---|
| | | VDD_VI.forceV(v);<br>v+=step;<br>#(20' us);<br>end<br>end |
| aa5 | Next | #('TESTER_TIME_STEP'); |
| aa6 | Var1=RXD_VI.Voltage.measure (<u>15</u>,'Array') | for(int ii=0; ii<<u>15</u>; ii++)<br>begin<br>Var1[ii]=RXD_VI.sense;<br>#('TESTER_TIME_STEP');<br>end |

FIG. 9 schematically shows an example of an embodiment of a method 400 that is similar to the method 200 illustrated in FIG. 4. At block 202, high-level test code 110 defined in a high-level test specification language 112 is recorded.

At block 204, automated analysis of the high-level test code 110 occurs before any conversion of the high-level test code 110 to the low-level test code 130.

The automated analysis at block 204 comprises partial simulation of testing of the target by the test module without conversion of the high-level test code 110 defined in the high-level test specification language 112 to the low-level test implementation language 132.

For example, the automated analysis performed at block 204 may comprise flagging 402 operational problems detected within the high-level test code 110 defined in the high-level test specification language 112 before conversion of the high-level test code 110 to the low-level test code 130.

For example, the flagging 402 performed by the analysis block 204, may flag problems in the syntax of the high-level test code 110.

For example, the flagging 402 may relate to the existence of disallowed or conflicting configurations of pin states (device under test states) and/or instrument states.

FIG. 10 schematically shows an example of an embodiment of a test module 146 (which may be real or simulated) and a target device 148 (which may be real or simulated). In this example, the testing module 146 comprises one or more instruments 404 and the target device 148 comprises one or more input/output pins 406.

Testing of the target device 148 by the testing module 146 involves the instruments 404 being configured in a particular instrument states to provide inputs to one or more of the pins 406 of the target device 148 and to receive output from one or more of the pins 406 of the target device 148.

A particular instrument 404 may or may not be connected to a particular pin 406 and, if connected to a particular pin 406, it may, for example, have an input state or it may, for example, have an output state. As an example, an input state of an instrument 404 may for example drive a voltage or current to a connected pin 406. An input state of an instrument 404 may, for example, read a voltage or current from a pin 406.

It will therefore be appreciated that a state of a pin 406 is dependent upon the input provided to it by an instrument 404 (if any) and the output (if any) provided from it as a consequence of the operation of the target device 148.

There will be certain configurations of the pin states of the target device 148 which are allowed and certain configurations of the pin states which are disallowed. For example, it would be disallowed for a particular pin to simultaneously receive input drives from two different instruments 404. Also, it would be disallowed for a particular pin to receive a driving voltage or driving current which is above its specified limit. Thus a configuration of pin states may be disallowed because a pin is driven to two conflicting states or because a pin is to be overloaded.

It is also possible to assess instrument states of the test module 146 for disallowed configurations of states. For example it would be disallowed if a particular instrument 404 were to be connected to receive an input from two different pins 406 of the target device 148.

The high-level test specification language 112 is configured to enable the definition of the interconnection of the instruments of the test module 146 with particular pins of a target device 148. It may also be configured to control explicitly whether a state of an instrument of the test module 146 is an input state or an output state and in respect of which pins 406 of the target device 148 it is an input state and an output state. It is therefore possible to create a data structure that relates the instruments 404 of the test module 146 and the pins 406 of the target device 148 such that the data structure records the interconnections of specific instruments 404 and pins 406 and records the states of the instruments 404 and the states of the pins 406. Consequently from only the high-level test specification language 112 it is possible to identify disallowed configurations of the instruments 404 and/or disallowed configurations of the pins 406 using the data structure.

Using the method 400 it is possible to create flags in relation to: maximum rating violations, pin/instrument contention, simultaneous updated voltage and current ranges on an instrument, wrong target device mode assumption, wrong instrument state assumptions, typos in variables and variables used to operate instruments, typos in test numbers to be data logged. Pin contention happens when two or more instruments are connected to a pin with conflicting states.

An example of an allowed configuration of instrument states would be when a first instrument 404 is connected to a first pin 406 and a second instrument is also connected to the first pin 406. If the first instrument 404 is in a voltage input state and is applying a voltage to the first pin 406 and the second instrument is in a high-impedance state then there is no contention between the operation of the first instrument 404 and the second instrument 404 and the configuration of the instrument state is allowed.

If however in this scenario the state of the first instrument 404 was as before and it was applying voltage to the first pin 406 but the second instrument was applying a different voltage to the first pin 406 then there is a contention between the desired operation of the pin by the first instrument 404 and the second instrument 404 and this is a disallowed configuration of instrument states. The first pin 406 in this example has simultaneously two incompatible states and this represents a disallowed configuration of the first pin 406.

The high-level test code 110 defined in a high-level test specification language 112 may comprise test sequences which are executed in series. Each test sequence comprises one or more instructions and each instruction can potentially change the state of the testing instruments and/or the device under test during the test sequence.

The test code 110 may be modularized by creating modules for each sequence, where a module has a defined expected start state (EX_START) explicitly defined using high-level test specification language 112, and/or a defined expected end state (EX_END) explicitly defined using high-level test specification language 112, The actual start state (ATL_START) of the module is defined by the instructions of the preceding module in the test code 110. The actual end state (ATL_END) of the module is defined by the instructions of the module itself.

One or more default start states may be used to define an expected start state for a module. That is an expected start state (EX_START) may be selected from a library of predefined states specified as, for example, a single line instruction in the high-level test specification language 112, One or more default end states may be used to define an expected end state for a module. That is an expected end state (EX_END) may be selected from a library of predefined states specified, as, for example, a single line instruction in the high-level test specification language 112, At block 204, automated analysis of the high-level test code 110 occurs before any conversion of the high-level test code 110 to the low-level test code 130. The automated analysis at block 204 comprises partial simulation of testing of the target by the test module without conversion of the high-level test code 110 defined in the high-level test specification language 112 to the low-level test implementation language 132. This may for example comprise simulating the
an actual state arising at defined point in execution and comparing it with an expected state that is expected at the defined point of execution. The expected state may be explicitly defined.

For example, the method may comprise simulating an actual start state (ATL_START) of a module and comparing it to the explicitly defined expected start state (EX_START) of that module and/or simulating the actual start end (ATL_END) of a module and comparing it to the explicitly defined expected end state (EX_END) of that module.

An expected start state (EX_START) may be defined for an instrument, for a device under test or for both an instrument and a device under test. An expected end state (EX_END) may be defined for an instrument, for a device under test or for both an instrument and a device under test.

An expected start state (EX_START) for an instrument may record the expected state of all instruments as a test sequence starts. The states may, for example, include connection (connected or not), value (e.g. force voltage of 5V), clamps, ranges, etc.

An expected end state (EX_END) for an instrument may record the expected state of all instruments as a test sequence ends. The states may, for example, include connection (connected or not), value (e.g. force voltage of 5V), clamps, ranges, etc.

An expected start state (EX_START) for a device under test may record the expected state of device under test as a test sequence starts. The states may, for example, include JTAG mode, Test Mode, Functional Mode, SPI communication mode etc.

An expected end state (EX_END) for a device under test may record the expected state of the device under test as a test sequence ends.

FIG. 11 schematically shows an example of an embodiment that determines timing of the high-level test code 110.

The automated analysis at block 204 may comprise partial simulation of testing of the target by the test module without conversion of the high-level test code 110 defined in the high-level test specification language 112 to the low-level test implementation language 132. This partial simulation may be used to estimate timing of a test specified by the high-level test code 110.

In this example, the time taken to execute the low-level test code 130 created by converting the high-level test code 110 to the low-level test code 130 is estimated before the conversion has taken place by considering the time taken to perform the portions of the low-level test code 130 that are associated with the portions of the high-level test code 110.

For example, in FIG. 11 the instructions $114_n$ of the high-level test code 110 are illustrated. The first instruction $114_1$ is a serial instruction and it takes a time $t_1$ to perform. The time $t_1$ may for example be determined by looking up a value associated with the particular first instruction $114_1$ in a library that records a time value that is specific to the low-level test implementation language 132 that it is intended to convert high-level test code 110 to. If it were intended to convert the high-level test code 110 to a different lower-level test implementation language 132 then it would be necessary to use a different library.

The next instruction, the second instruction $114_2$ is also a serial instruction and it takes a time $t_2$ to perform. The time $t_2$ may for example be determined by looking up a value associated with the particular second instruction $114_2$ in a library that records a time value that is specific to the low-level test implementation language 132 that it is intended to convert high-level test code 110 to. If it were intended to convert the high-level test code 110 to a different lower-level test implementation language 132 then it would be necessary to use a different library.

The third and fourth instructions $114_3$ and $114_4$ are parallel instructions and these are executed in parallel according to a timing $t_3$ specified by the high-level test code 110.

The time associated with a serial instruction, for example the time $t_1$, in FIG. 11 may be estimated by estimating for the first instruction $114_1$ separately:
i) a time taken to upload data at a test module to perform low-level instruction(s) in the lower-level test implementation language 132 that correspond to the first high-level instruction $114_1$ in the high-level test specification language 112;
ii) a time taken to execute the corresponding low-level instruction(s) (that correspond to the first high-level instruction 114) in the low-level test implementation language 132; and
iii) a time taken to transfer data after execution of the corresponding low-level instruction(s).

The time taken for upload, and/or execution and/or download for a specific high-level instruction 114 may for example be stored in a lower-layer test implementation language specific library.

This process is repeated for each serial instruction and the time values accumulated. The accumulated value is then added to the times determined for the parallel instructions to obtain a timing estimate.

It is possible for the various times associated with the various instructions $114_n$ of the high-level test code 110 to be estimated while the high-level test code 110 is being written. It is therefore possible to have a real-time estimate of the time required for testing or implementing the high-level test code 110 in a specific testing module without having to convert the high-level test code 110 to low-level test code 130.

It may be desirable to perform a calibration process by calibrating the estimated time against actual times.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims and that the examples are merely illustrative.

For example, the connections may be an type of connection suitable to transfer signals from or to the respective nodes, units or devices, for example via intermediate devices. Accordingly, unless implied or stated otherwise the connections may for example be direct connections or indirect connections.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different systems. For example, although an exemplary architecture has been described, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received elements of the system, for example, from computer readable media such as memory or other media on other computer systems. Such computer readable media may be permanently, removably or remotely coupled to an information processing system such as system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, system is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method comprising:
   recording first test code defined in a high-level test specification language, wherein the first test code comprises a set of high-level instructions;
   analyzing the first test code, wherein in analyzing the first test code, the method further comprises:
      simulating a test of a target by a test module with the first test code;
      for each high-level instruction, determining whether the high-level instruction is a serial instruction or a parallel instruction; and for each high-level instruction, performing different estimates of time taken during testing to perform the high-level instruction in dependence upon said determination, wherein the performing different estimates of the time comprises estimating for each high-level instruction of the first test code defined in the high-level test specification language an upload time, an execution time, and a download time, the upload time being a time taken to upload data at the test module to perform a low-level instruction in the low-level test implementation language corresponding to the high-level instruction, the execution time being a time taken to execute the low-level instruction in the low-level test implementation language that corresponds to the high-level instruction, and the download time being a time taken to transfer data after execution of the low-level instruction in the low-level test implementation language that corresponds to the high-level instruction;

converting the first test code to second test code defined in a low-level test implementation language;

testing of the target by the test module using the second test code, wherein the performing different estimates operation is performed prior to the converting operation to determine an estimate of time taken to execute the portions of the second test code that are associated with corresponding portions of the first test code during the testing operation;

adding third test code defined in the low-level test implementation language to the second test code in response to testing of the target using the second test code; and incorporating the third test code into the first test code.

2. A method as claimed in claim 1, wherein the target is a real or simulated semiconductor device or integrated circuit.

3. A method as claimed in claim 1, wherein, in analyzing the first test code, the method further comprises:
adapting the first test code.

4. A method as claimed in claim 3, wherein, in adapting the first test code, the method further comprises:
removing a first portion of test code from the first test code;
adding a second portion of test code to the first test code; and
editing of a third portion of the first test code.

5. A method as claimed in claim 3, wherein, in adapting the first test code the method further comprises:
adding a first portion of test code to the first test code, the first portion of test code being defined in the high-level test specification language; and
adding a second portion of test code to the second test code, the second portion of test code being defined in the low-level test implementation language.

6. A method as claimed in claim 3, wherein, in adapting the first test code, the method further comprises:
adapting a first portion of the first test code in response to a change in a corresponding first portion of fourth test code defined in the low-level test implementation language.

7. A method as claimed in claim 1, wherein, in analyzing the first test code, the method further comprises:
associating a portion of the first test code with a tag, and wherein in converting the first test code to the second test code, the portion of the first test code associated with the tag is converted into a corresponding portion of the second test code that is also associated with the tag.

8. A method as claimed in claim 1, further comprising;
adding new test code to the first test code in response to definition of new low-level code in low-level test code corresponding to the test code, wherein the new test code is defined using the high-level test specification language if the new low-level code can be disassembled into high-level test specification language and is defined using the low-level test implementation language if the new low-level code cannot be disassembled into high-level test specification language.

9. A method as claimed in claim 1, wherein in analyzing the first test code, the method further comprises:
detecting an operational problem within the first test code prior to converting the first test code to the second test code; and
flagging the operational problem.

10. A method as claimed in claim 1, further comprising:
assessing simulated states of a device under test against expected states.

11. A method as claimed in claim 1, further comprising:
assessing simulated pin states of the target for allowed and disallowed configurations of pin states.

12. A method as claimed in claim 11, wherein a disallowed configuration of pin states exists because a pin is to be driven to two conflicting states or because a pin is to be overloaded.

13. A method as claimed in claim 1, further comprising:
assessing simulated test module states for disallowed configurations of states.

14. A method as claimed in claim 1, further comprising:
producing a data structure recording interconnections of pins of the target and instruments of the test module and states of pins determined by interconnected instruments.

15. An apparatus comprising:
a processor; and
a computer program code stored in memory that, when executed by the processor, performs a method comprising:
recording first test code defined in a high-level test specification language, wherein the first test code comprises a set of high-level instructions;
analyzing the first test code, wherein analyzing the first test code includes simulating a test of a target by a test module with the first test code, determining for each high-level instruction, whether the high-level instruction is a serial instruction or a parallel instruction, and performing different estimates of time taken during testing to perform the high-level instruction in dependence upon said determination, wherein the performing different estimates of the time comprises estimating for each high-level instruction of the first test code defined in the high-level test specification language an upload time, an execution time, and a download time, the upload time being a time taken to upload data at the test module to perform a low-level instruction in the low-level test implementation language corresponding to the high-level instruction, the execution time being a time taken to execute the low-level instruction in the low-level test implementation language that corresponds to the high-level instruction, and the download time being a time taken to transfer data after execution of the low-level instruction in the low-level test implementation language that corresponds to the high-level instruction;

converting the first test code to second test code defined in a low-level test implementation language;

testing of the target by the test module using the second test code, wherein the performing different estimates operation is performed prior to the converting operation to determine an estimate of time taken to execute the portions of the second test code that are associated with corresponding portions of the first test code during the testing operation;

adding third test code defined in the low-level test implementation language to the second test code in response to testing of the target using the second test code; and incorporating the third test code into the first test code.

16. A tangible, non-transitory data carrier stored with computer program that, when run on a computer, performs a method comprising:

recording first test code defined in a high-level test specification language, wherein the first test code comprises a set of high-level instructions;

analyzing the first test code, wherein in analyzing the first test code, the method further comprises:

simulating a test of a target by a test module with the first test code;

for each high-level instruction, determining whether the high-level instruction is a serial instruction or a parallel instruction; and performing different estimates of time taken during testing to perform the high-level instruction in dependence upon said determination, wherein the performing different estimates of the time comprises estimating for each high-level instruction of the first test code defined in the high-level test specification language an upload time, an execution time, and a download time, the upload time being a time taken to upload data at the test module to perform a low-level instruction in the low-level test implementation language corresponding to the high-level instruction, the execution time being a time taken to execute the low-level instruction in the low-level test implementation language that corresponds to the high-level instruction, and the download time being a time taken to transfer data after execution of the low-level instruction in the low-level test implementation language that corresponds to the high-level instruction;

converting the first test code to second test code defined in a low-level test implementation language;

testing of the target by the test module using the second test code, wherein the performing different estimates operation is performed prior to the converting operation to determine an estimate of time taken to execute the portions of the second test code that are associated with corresponding portions of the first test code during the testing operation;

adding third test code defined in the low-level test implementation language to the second test code in response to testing of the target using the second test code; and incorporating the third test code into the first test code.

* * * * *